(12) United States Patent
Chang et al.

(10) Patent No.: US 12,429,360 B2
(45) Date of Patent: Sep. 30, 2025

(54) ELECTRONIC DEVICE

(71) Applicant: Merry Electronics(Shenzhen) Co., Ltd., ShenZhen (CN)

(72) Inventors: Po Kai Chang, Taichung (TW); Yung-Hsiang Chang, Taichung (TW); Jia Yin Wu, Taichung (TW)

(73) Assignee: Merry Electronics(Shenzhen) Co., Ltd., ShenZhen (CN)

( * ) Notice: Subject to any disclaimer, the term of this patent is extended or adjusted under 35 U.S.C. 154(b) by 272 days.

(21) Appl. No.: 18/358,896

(22) Filed: Jul. 25, 2023

(65) Prior Publication Data

US 2025/0035466 A1    Jan. 30, 2025

(51) Int. Cl.
*G01D 5/02* (2006.01)
*G01D 11/24* (2006.01)

(52) U.S. Cl.
CPC .............. *G01D 5/02* (2013.01); *G01D 11/245* (2013.01)

(58) Field of Classification Search
CPC ................................ G01D 5/02; G01D 11/245
See application file for complete search history.

(56) References Cited

U.S. PATENT DOCUMENTS

| | | | | |
|---|---|---|---|---|
| 9,432,759 B2 * | 8/2016 | Elian | ...................... | H04R 1/406 |
| 2018/0148323 A1 * | 5/2018 | Ghidoni | ................. | G01J 1/0271 |
| 2020/0056934 A1 * | 2/2020 | Parker | ................... | B81B 7/0061 |
| 2021/0302227 A1 * | 9/2021 | Chen | ....................... | G01H 11/08 |
| 2022/0404196 A1 * | 12/2022 | Chen | ....................... | H04R 1/04 |
| 2022/0408197 A1 * | 12/2022 | Chen | ...................... | B81B 7/0061 |

FOREIGN PATENT DOCUMENTS

| | | | | |
|---|---|---|---|---|
| CN | 205140944 U | * | 4/2016 | |
| CN | 104865002 B | * | 4/2017 | |
| CN | 208094792 U | * | 11/2018 | |
| CN | 209017323 U | * | 6/2019 | ............. H04R 19/04 |
| CN | 116600223 A | * | 8/2023 | ............... H04R 1/08 |
| DE | 102009047508 A1 | * | 6/2011 | ......... G01L 19/0061 |
| DE | 102012209235 B4 | * | 8/2023 | ............... H04R 1/04 |

\* cited by examiner

*Primary Examiner* — Jamel E Williams
(74) *Attorney, Agent, or Firm* — JCIPRNET

(57) ABSTRACT

An electronic device, including a substrate, a package component, a first sensor chip, and a second sensor chip, is provided. The substrate has an inner space and a first through hole communicated with the inner space. The package component is disposed on the substrate and forms a front chamber and a back chamber together with the substrate. The package component has an opening. The front chamber is communicated with an outside air by the opening. The inner space constitutes at least part of the back chamber, and the back chamber is communicated with the front chamber by the first through hole. The first sensor chip is disposed on the substrate and covers the first through hole to separate an airflow in the front chamber and an airflow in the back chamber. The second sensor chip is disposed on the substrate and located in the back chamber.

18 Claims, 4 Drawing Sheets

ELECTRONIC DEVICE

BACKGROUND

Technical Field

The disclosure relates to an electronic device.

Description of Related Art

In the electronic device, two sensor chips are usually respectively formed into two independent packages (with their own package components, substrates, etc.), and the environmental conditions to be sensed (for example, sound, air pressure, temperature, etc.) are detected by respective openings directly connected to the outside air. Since there needs to be a certain distance between the two packages during assembly, the volume adjustment flexibility of the electronic device is relatively small.

SUMMARY

The disclosure provides an electronic device, which can improve the volume adjustment flexibility of the electronic device while having preferred sensing sensitivity.

An electronic device of the disclosure includes a substrate, a package component, a first sensor chip, and a second sensor chip. The substrate has an inner space and a first through hole communicated with the inner space. The package component is disposed on the substrate and forms a front chamber and a back chamber together with the substrate. The package component has an opening. The front chamber is communicated with an outside air through the opening. The inner space constitutes at least part of the back chamber, and the back chamber is communicated with the front chamber through the first through hole. The first sensor chip is disposed on the substrate and covers the first through hole to separate an airflow in the front chamber and an airflow in the back chamber. The second sensor chip is disposed on the substrate and located in the back chamber.

In an embodiment of the disclosure, the first sensor chip includes a diaphragm and a vent hole formed on the diaphragm.

In an embodiment of the disclosure, the back chamber is a closed chamber, and air in the back chamber is only circulated by the vent hole.

In an embodiment of the disclosure, the inner space is composed of a top portion and a bottom portion of the substrate and a connecting portion connecting the top portion and the bottom portion.

In an embodiment of the disclosure, the electronic device further includes a reinforcing structure disposed in the inner space. Two ends of the reinforcing structure are respectively in direct contact with the top portion and the bottom portion.

In an embodiment of the disclosure, the reinforcing structure includes a conductive material, so that the first sensor chip and/or the second sensor chip are electrically connected to the bottom portion via the top portion and the reinforcing structure.

In an embodiment of the disclosure, the substrate further includes a welding pad disposed on the bottom portion and located on an opposite side of the reinforcing structure, and an orthographic projection of the reinforcing structure on the bottom portion overlaps with an orthographic projection of the welding pad on the bottom portion.

In an embodiment of the disclosure, the opposite side does not have any opening.

In an embodiment of the disclosure, the reinforcing structure includes at least one internal reinforcing component disposed in a central region of the inner space.

In an embodiment of the disclosure, the reinforcing structure includes at least one edge reinforcing component disposed in a peripheral region of the inner space and in direct contact with the connecting portion.

In an embodiment of the disclosure, the first sensor chip and the second sensor chip are located on two opposite sides of the top portion.

In an embodiment of the disclosure, the package component is made of a metal material.

In an embodiment of the disclosure, the second sensor chip includes an environment sensing element to sense an air condition from an outside environment.

In an embodiment of the disclosure, the environment sensing element senses air entering the back chamber via the front chamber.

In an embodiment of the disclosure, the package component has a separating wall and a cover, the separating wall is disposed on the substrate and separates different chambers, and the cover is disposed on the separating wall.

In an embodiment of the disclosure, the back chamber includes a first back chamber and a second back chamber, the first back chamber is formed in the inner space of the substrate, and the second back chamber is formed in a space jointly defined by the separating wall, the cover, and the substrate.

In an embodiment of the disclosure, the first sensor chip and the second sensor chip are arranged in a horizontal direction, and the second sensor chip is located in the second back chamber.

In an embodiment of the disclosure, the substrate includes a second through hole. The second through hole is misaligned with the second sensor chip, so that the first back chamber and the second back chamber form an air communication.

In an embodiment of the disclosure, an orthographic projection of the first back chamber on the substrate overlaps with orthographic projections of the front chamber and the second back chamber on the substrate.

Based on the above, in the structural design of the electronic device of the disclosure, at least two sensor chips may be accommodated in a single package, and the flow path of the outside air may be controlled, so that after flowing into the front chamber from the opening, the outside air then flows into the back chamber via the sensor chip disposed therein. Therefore, the outside air may also be sensed by another sensor chip in the back chamber. In this way, the volume adjustment flexibility of the electronic device can be improved while having preferred sensing sensitivity.

In order for the features and advantages of the disclosure to be more comprehensible, the following specific embodiments are described in detail in conjunction with the drawings.

DESCRIPTION OF THE EMBODIMENTS

Figure 1:
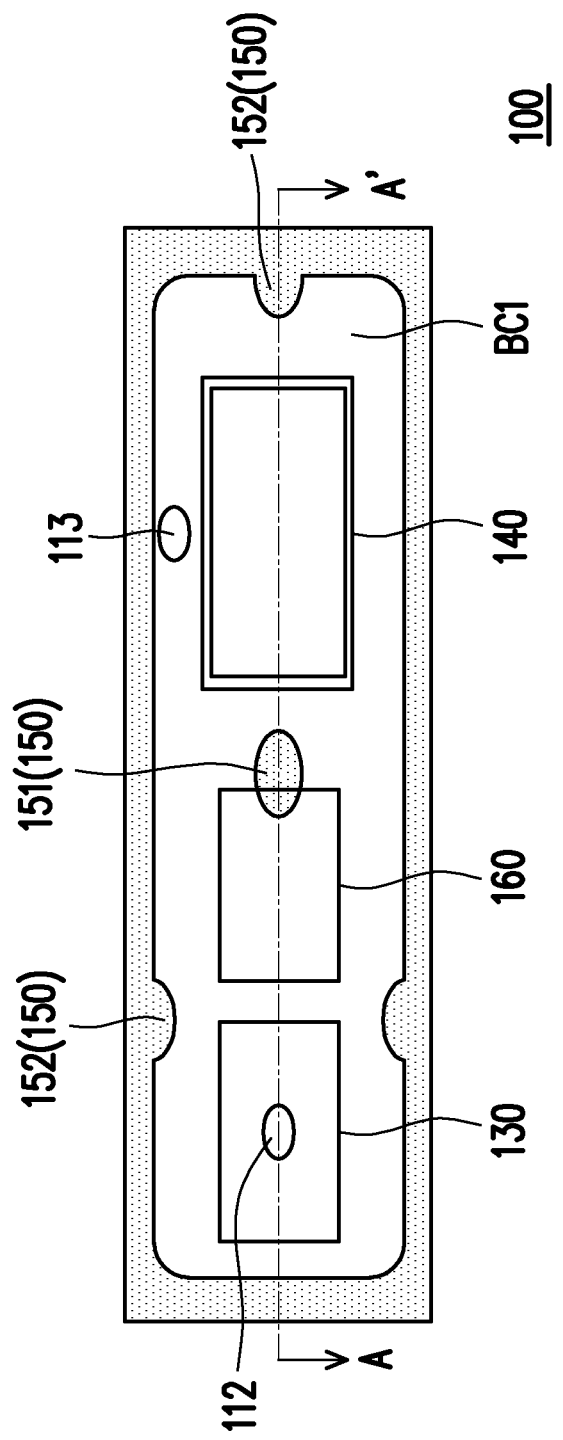
FIG. 1 is a schematic top view of an electronic device according to an embodiment of the disclosure.

Directional terms (for example, upper, lower, right, left, front, back, top portion, and bottom portion) used herein are used only with reference to the drawings and are not intended to imply absolute orientation.

The disclosure will be described more fully with reference to the drawings of the embodiments. However, the disclosure may also be embodied in various forms and should not be limited to the embodiments described herein. The thicknesses, dimensions, or sizes of layers or regions in the drawings may be exaggerated for clarity. The same or similar reference numerals indicate the same or similar elements and will not be repeated one by one in the following paragraphs. Moreover, the description of well-known components, methods, and materials may be omitted so as not to obscure the description of various principles of the disclosure.

It should be understood that although terms such as "first" and "second" may be used herein to describe various elements, components, regions, layers, and/or parts, the elements, components, regions, layers, and/or parts should not be limited by the terms. The terms are only used to distinguish one element, component, region, layer, or part from another element, component, region, layer, or part.

Unless otherwise defined, all terms (including technical and scientific terms) used herein have the same meaning as commonly understood by persons skilled in the art to which the disclosure belongs.

Figure 2:
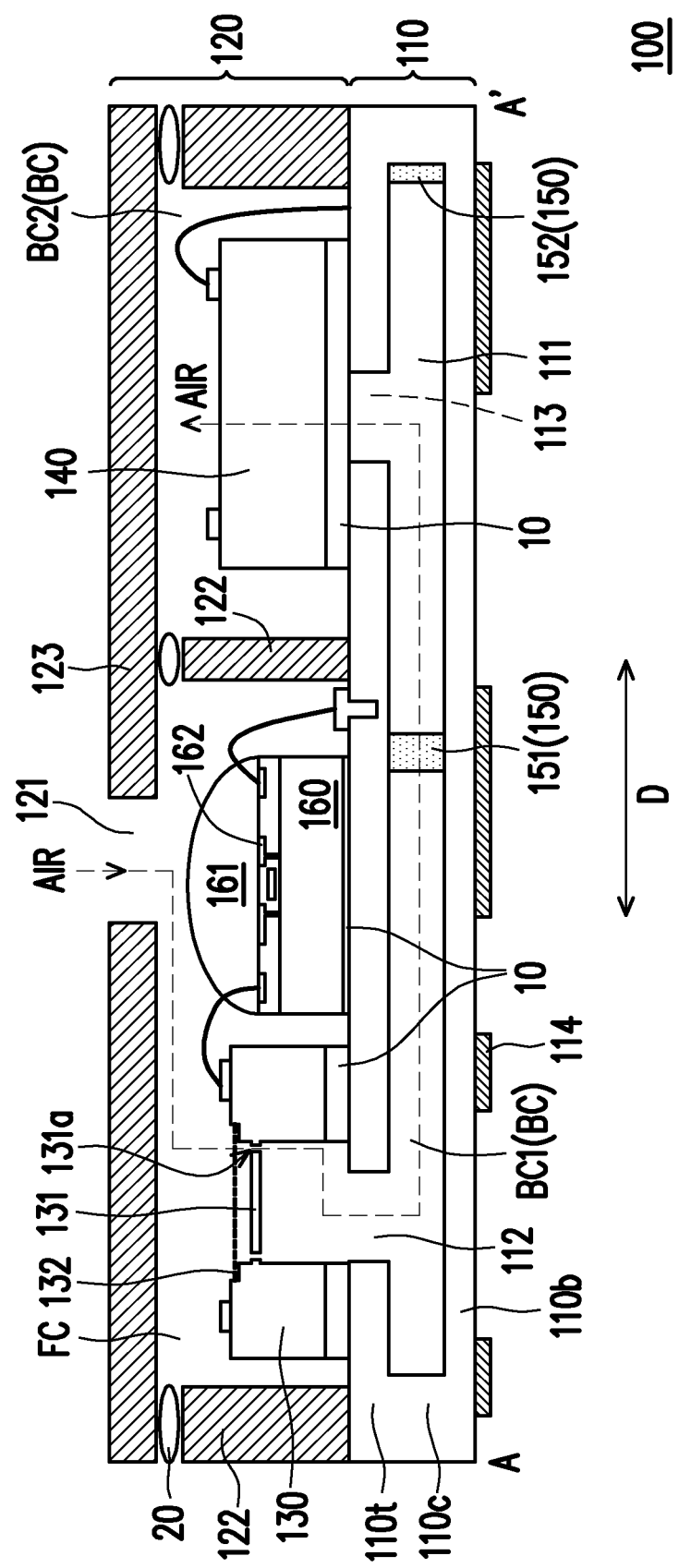
FIG. 2 is a schematic cross-sectional view along a line A-A' in FIG. 1.

FIG. 1 is a schematic top view of an electronic device according to an embodiment of the disclosure. FIG. 2 is a schematic cross-sectional view along a line A-A' in FIG. 1.

Please refer to FIG. 1 and FIG. 2. An electronic device 100 of the embodiment at least includes a substrate 110, a package component 120, a first sensor chip 130, and a second sensor chip 140, wherein the substrate 110 has an inner space 111 and a first through hole 112 communicated with the inner space 111. Here, the inner space 111 is composed of, for example, a top portion 110t and a bottom portion 110b of the substrate 110 and a connecting portion 110c connecting the top portion 110t and the bottom portion 110b. In other words, the inner space 111 may be surrounded by the top portion 110t and the bottom portion 110b of the substrate 110 and the connecting portion 110c.

In addition, the package component 120 is disposed on the substrate 110 and forms a front chamber FC and a back chamber BC together with the substrate 110, and the package component 120 has an opening 121, so that the front chamber FC is communicated with an outside air AIR by the opening 121, wherein the inner space 111 constitutes at least part of the back chamber BC, and the back chamber BC is communicated with the front chamber FC by the first through hole 112.

Further, the first sensor chip 130 is disposed on the substrate 110 and covers the first through hole 112 to separate an airflow in the front chamber FC and an airflow in the back chamber BC, and the second sensor chip 140 is disposed on the substrate 110 and located in the back chamber BC. Accordingly, in the structural design of the electronic device 100 of the embodiment, at least two sensor chips (the first sensor chip 130 and the second sensor chip 140) may be accommodated in a single package, and the flow path of the outside air AIR (as shown by the flow direction of the dotted line in FIG. 2) may be controlled, so that after flowing into the front chamber FC from the opening 121, the outside air AIR then flows into the back chamber BC via the sensor chip (the first sensor chip 130) disposed therein. Therefore, the outside air AIR may also be sensed by another sensor chip (the second sensor chip 140) in the back chamber BC. In this way, the volume adjustment flexibility of the electronic device 100 can be improved while having preferred sensing sensitivity.

Further, the first sensor chip 130 includes a diaphragm 131 and a vent hole 131a formed on the diaphragm 131. In this way, air in the back chamber BC may only circulate by the vent hole 131a. In other words, the air in the back chamber BC is indirectly communicated with the outside air AIR rather than directly communicated with the outside air AIR, but the disclosure is not limited thereto.

On the other hand, since the size of the back chamber BC directly affects the level of sensing sensitivity, in the structural design of the embodiment, the package component 120 has a separating wall 122 and a cover 123, wherein the separating wall 122 is disposed on the substrate 110 and separates different chambers (as shown in FIG. 2, the separating wall 122 located on a middle region separates the front chamber FC and the back chamber BC, so that the back chamber BC is a closed chamber), and the cover 123 is disposed on the separating wall 122. In this way, the back chamber BC may include a first back chamber BC1 and a second back chamber BC2.

In addition, the substrate 110 may include a second through hole 113. The first back chamber BC1 is formed in the inner space 111 of the substrate 110, the second back chamber BC2 is formed in a space jointly defined by the separating wall 122, the cover 123, and the substrate 110, and the second through hole 113 is misaligned with the second sensor chip 140 (as shown in FIG. 1 and FIG. 2, the second through hole 113 of FIG. 2 is located at the back of the drawing rather than directly below the second sensor chip 140), so that the first back chamber BC1 and the second back chamber BC2 form an air communication. In this way, the back chamber BC may be maximized, which can significantly improve the sensing sensitivity to have a preferred signal-to-noise ratio (SNR), but the disclosure is not limited thereto.

In the embodiment, an orthographic projection of the first back chamber BC1 on the substrate 110, for example, overlaps with orthographic projections of the front chamber FC and the second back chamber BC2 on the substrate 110, the first sensor chip 130 and the second sensor chip 140 are, for example, arranged in a horizontal direction D, and the second sensor chip 140 is located in the second back chamber BC2, but the disclosure is not limited thereto.

In some embodiments, the first sensor chip 130 may be a microphone element to sense pressure changes generated by outside acoustic vibrations, and the second sensor chip 140 may include an environmental sensing element to sense air conditions (for example, the outside air entering the back chamber BC via the front chamber FC) from the outside environment. For example, the second sensor chip 140 may be a pressure sensing element (the interior may be in a vacuum state) to sense pressure changes caused by the outside air AIR flowing into the back chamber BC, but the disclosure is not limited thereto. In other embodiments, the second sensor chip may have other sensing functions, such as a temperature sensing function. Here, the electronic device 100 is, for example, a sports watch or other suitable electronic devices. In addition, when the first sensor chip 130 is the microphone element, the electronic device 100 further includes a processing chip 160, wherein the processing chip 160 may be an application specific integrated circuit (ASIC) to receive and process signals measured by the microphone element.

Further, when the second sensor chip 140 is the pressure sensing element, the second sensor chip 140 may have a component (not shown) similar to the diaphragm 131, so as to obtain the required physical quantity by the deformation of the diaphragm with the pressure. When the second sensor chip 140 is a temperature sensing element, the second sensor chip 140 may not have the component similar to the diaphragm 131. Therefore, the specific design of the second sensor chip 140 may be determined according to the physical quantity to be sensed, which is not limited by the disclosure.

In some embodiments, the first sensor chip 130, the processing chip 160, and the second sensor chip 140 may be disposed on the substrate 110 by an adhesive layer 10 (for example, an adhesive glue or any other suitable chip adhesive material), and the adhesive layer 20 may also be used to bond the separating wall 122 to the cover 123, but the disclosure is not limited thereto.

In some embodiments, the substrate 110 may be a circuit substrate. For example, the substrate 110 is a printed circuit board (PCB), and the processing chip 160 is disposed adjacent to the first sensor chip 130, so that a top portion pad of the first sensor chip 130 is electrically connected to the processing chip 160 by wire bonding, a top portion pad of the processing chip 160 is electrically connected to a top portion pad of the substrate 110 by wire bonding, and a top portion pad of the second sensor chip 140 is electrically connected to the substrate 110 by wire bonding, that is, the first sensor chip 130 and the second sensor chip 140 are both electrically connected to the same substrate 110. In this way, the thickness of the substrate 110 can be effectively reduced while satisfying the length of the circuit layout, but the disclosure is not limited thereto. The processing chip 160, the first sensor chip 130, and the second sensor chip 140 may be configured and connected according to actual design requirements.

In addition, the processing chip 160 may further include an insulating layer 161 and an inner circuit structure 162, wherein the insulating layer 161 covers the bonding wires, and the inner circuit structure 162 is electrically connected to the bonding wires. Here, the insulating layer 161 and the inner circuit structure 162 may be any suitable composition applied to the processing chip 160, which is not limited by the disclosure.

In some embodiments, in order to enhance the structural rigidity of the substrate 110, the substrate 110 further includes a reinforcing structure 150 disposed in the inner space 111, wherein the two ends of the reinforcing structure 150 are respectively in direct contact with the top portion 110t and the bottom portion 110b. In this way, the stress acting on the substrate 110 can be effectively dispersed, which can improve the reliability of the electronic device 100, but the disclosure is not limited thereto. Here, the disclosure does not limit the dimensions of the reinforcing structure 150, which may be determined according to actual design requirements.

In some embodiments, the substrate 110 further includes a welding pad 114 disposed on the bottom portion 110b and located on the opposite side of the reinforcing structure 150. As shown in FIG. 2, under the structural design of the disclosure, the opening 121 communicated with the outside air AIR and the welding pad 114 are located on two opposite sides of the package. Therefore, the probability of pollutants (for example, tin splashing) of the welding pad 114 entering the opening 121 and affecting the performance of the electronic device 100 can be reduced, and processing is easy, but the disclosure is not limited thereto. Here, the welding pad 114 may be an electrode.

In some embodiments, there is no opening on the opposite side of the bottom portion 110b, that is, the outside air AIR cannot enter the electronic device 100 from the bottom portion 110b of the substrate 110, but the disclosure is not limited thereto.

In some embodiments, the reinforcing structure 150 includes at least one internal reinforcing component 151 and/or at least one edge reinforcing component 152, wherein the internal reinforcing component 151 is disposed in a central region of the inner space 111, and the edge reinforcing component 152 is disposed in a peripheral region of the inner space 111 and in direct contact with the connecting portion 110c. In this way, support rigidity can be effectively provided to the entire electronic device 100, but the disclosure is not limited thereto.

In some embodiments, the reinforcing structure 150 is disposed adjacent to, such as directly below, the processing chip 160, the first sensor chip 130, and the second sensor chip 140, so as to support the processing chip 160, the first sensor chip 130, and the second sensor chip 140 more reliably, but the disclosure is not limited thereto.

In some embodiments, a computer simulation system may be used to analyze the rigidity distribution of the overall structure of the electronic device 100, so as to obtain a preferred setting position of the reinforcing structure 150, but the disclosure is not limited thereto.

In some embodiments, the reinforcing structure 150 may be disposed at the position of the long side of the electronic device 100 to reduce the probability of deformation of the long side, but the disclosure is not limited thereto.

In some embodiments, the reinforcing structure 150 includes a conductive material, so that the first sensor chip 130 and/or the second sensor chip 140 are electrically connected to the bottom portion 110b via the top portion 110t and the reinforcing structure 150, so as to shorten the conductive path. In addition, when the welding pad 114 is solder paste, a high temperature process such as reflow needs to be used. Therefore, the position where the welding pad 114 is at bears a relatively large stress, which may easily generate warpage, thereby reducing the product sensitivity. Therefore, in the embodiment, an orthographic projection of the reinforcing structure 150 of a conductive member on the bottom portion 110b may overlap with an orthographic projection of the welding pad 114 on the bottom portion 110b. In this way, in addition to shortening the conductive path, the stress at the position where the welding pad 114 is at can also be effectively dispersed, but the disclosure is not limited thereto. In other embodiments, the reinforcing structure 150 may be an electrically insulating material, so the first sensor chip 130 and/or the second sensor chip 140 are electrically connected to the bottom portion 110b via the top portion 110t and the connecting portion 110c.

In some embodiments, the package component 120 is, for example, made of a metal material to have an electromagnetic shielding function. For example, the material of the separating wall 122 includes stainless steel and brass, and the material of the cover 123 includes stainless steel and copper, but the disclosure is not limited thereto.

In some embodiments, the material of the diaphragm 131 includes plastic (for example, polytetrafluoroethylene (PTFE), polyethylene (PE), polyimide (PI), or polyether ether ketone (PEEK)).

In some embodiments, the first sensor chip 130 further includes a back plate 132 having multiple through holes, wherein the back plate 132 may be made of a suitable insulating material, which is not limited by the disclosure.

It should be noted that each of the above elements may be made of any other suitable material. In addition, the above film layers and components may be formed and configured with each other (such as providing a substrate, placing a sensor chip thereon, and packaging the same with a package component) using any suitable process (such as using a drilling process to make a through hole), which is not limited by the disclosure.

It must be noted here that the following embodiment continues to use the reference numerals and some content of the foregoing embodiment, wherein the same or similar reference numerals are adopted to denote the same or similar elements, and the description of the same technical content is omitted. For the description of the omitted part, reference may be made to the foregoing embodiment, which will not be repeated in the following embodiment.

Figure 3:
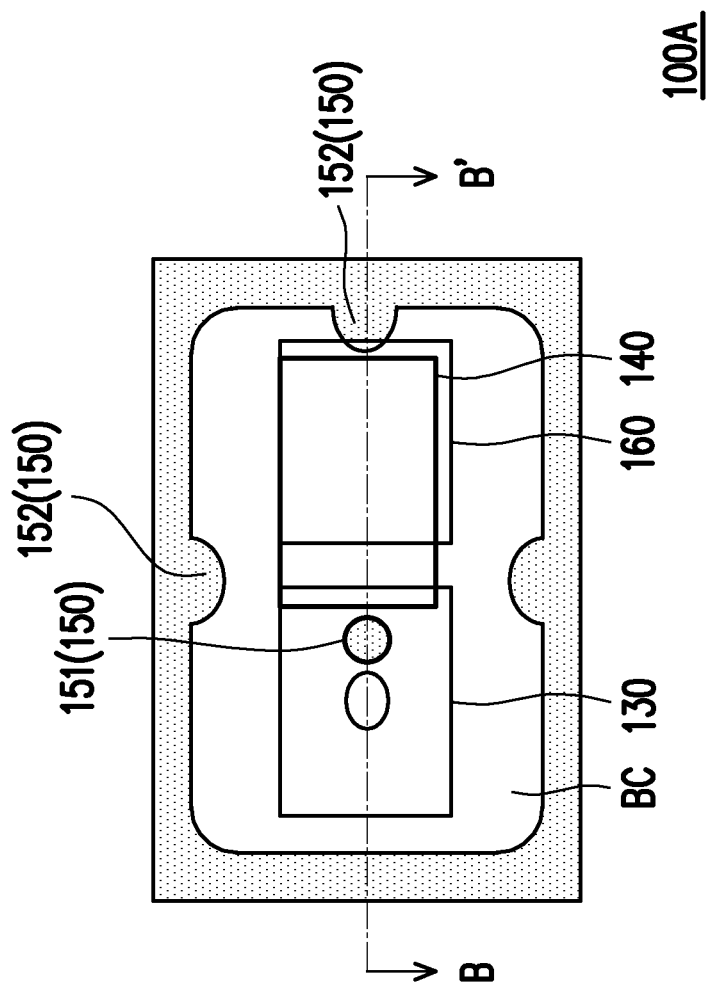
FIG. 3 is a schematic top view of an electronic device according to another embodiment of the disclosure.
Figure 4:
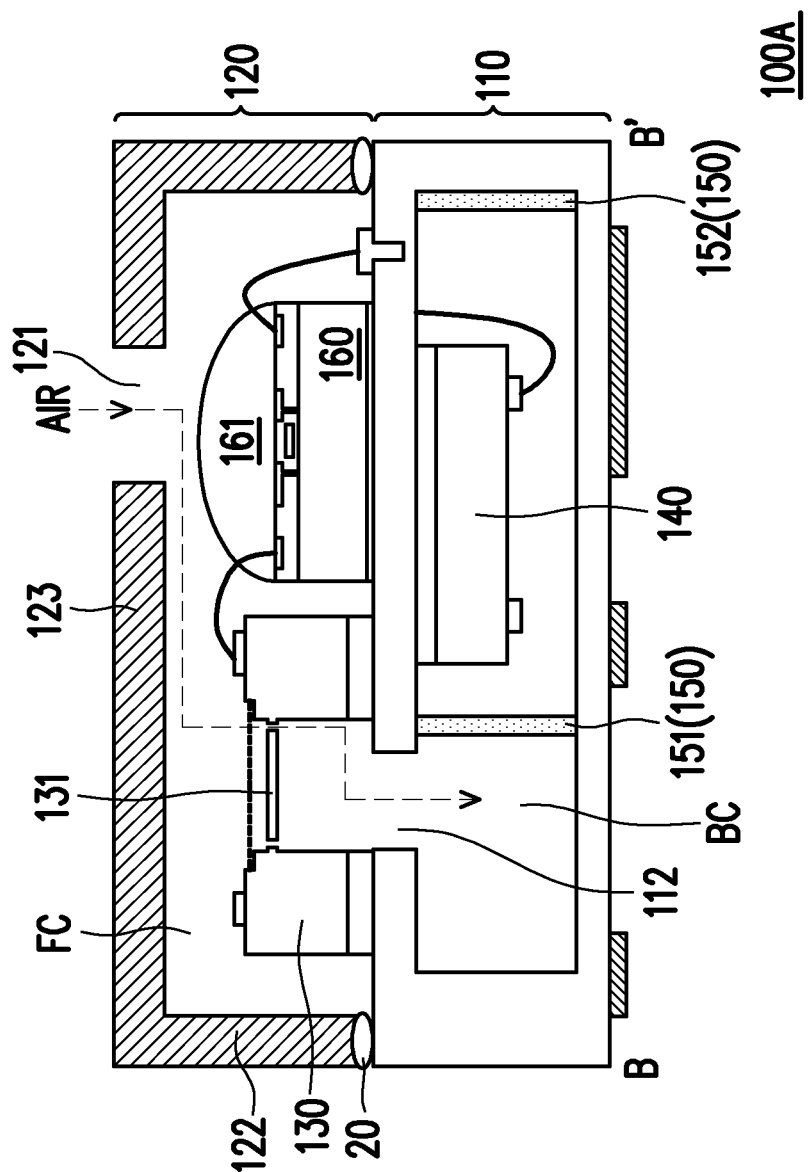
FIG. 4 is a schematic cross-sectional view along a line B-B' in FIG. 3.

FIG. 3 is a schematic top view of an electronic device according to another embodiment of the disclosure. FIG. 4 is a schematic cross-sectional view along a line B-B' in FIG. 3.

Please refer to FIG. 3 and FIG. 4. Compared with the electronic device 100 of FIG. 1 and FIG. 2, the first sensor chip 130 and the second sensor chip 140 of an electronic device 100A are located on two opposite sides of the top portion 110t to reduce the lateral volume. Further, an orthographic projection of the second sensor chip 140 on the substrate 110 may overlap with an orthographic projection of the first sensor chip 130 on the substrate 110 and/or an orthographic projection of the processing chip 160 on the substrate 110. In addition, the electronic device 100A may not have the first back chamber BC1 and the second back chamber BC2 separated by the second through hole 113 as shown in FIG. 2, that is, in the embodiment, the substrate 110 only has the first through hole 112 and does not have the second through hole, but the disclosure is not limited thereto.

In the embodiment, the separating wall 122 may be bonded to the substrate 110 by the adhesive layer 20, but the disclosure is not limited thereto.

In summary, in the structural design of the electronic device of the disclosure, at least two sensor chips may be accommodated in a single package, and the flow path of the outside air may be controlled, so that after flowing into the front chamber from the opening, the outside air then flows into the back chamber via the sensor chip disposed therein. Therefore, the outside air may also be sensed by another sensor chip in the back chamber. In this way, the volume adjustment flexibility of the electronic device can be improved while having preferred sensing sensitivity.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. An electronic device, comprising:
   a substrate, having an inner space and a first through hole communicated with the inner space;
   a package component, disposed on the substrate and forming a front chamber and a back chamber together with the substrate, wherein the package component has an opening, and the front chamber is communicated with an outside air by the opening, wherein the inner space constitutes at least part of the back chamber, and the back chamber is communicated with the front chamber by the first through hole;
   a first sensor chip, disposed on the substrate and covering the first through hole to separate an airflow in the front chamber and an airflow in the back chamber, wherein the first sensor chip comprises a diaphragm and a vent hole formed on the diaphragm; and
   a second sensor chip, disposed on the substrate and located in the back chamber.

2. The electronic device according to claim 1, wherein the back chamber is a closed chamber, and air in the back chamber is only circulated by the vent hole.

3. The electronic device according to claim 1, wherein the inner space is composed of a top portion and a bottom portion of the substrate and a connecting portion connecting the top portion and the bottom portion.

4. The electronic device according to claim 3, further comprising a reinforcing structure disposed in the inner space, wherein two ends of the reinforcing structure are respectively in direct contact with the top portion and the bottom portion.

5. The electronic device according to claim 4, wherein the reinforcing structure comprises a conductive material, so that the first sensor chip and/or the second sensor chip are electrically connected to the bottom portion via the top portion and the reinforcing structure.

6. The electronic device according to claim 5, wherein the substrate further comprises a welding pad disposed on the bottom portion and located on an opposite side of the reinforcing structure, and an orthographic projection of the reinforcing structure on the bottom portion overlaps with an orthographic projection of the welding pad on the bottom portion.

7. The electronic device according to claim 6, wherein the opposite side does not have any opening.

8. The electronic device according to claim 4, wherein the reinforcing structure comprises at least one internal reinforcing component disposed in a central region of the inner space.

9. The electronic device according to claim 4, wherein the reinforcing structure comprises at least one edge reinforcing component disposed in a peripheral region of the inner space and in direct contact with the connecting portion.

10. The electronic device according to claim 3, wherein the first sensor chip and the second sensor chip are located on two opposite sides of the top portion.

11. The electronic device according to claim 1, wherein the package component is made of a metal material.

12. The electronic device according to claim 1, wherein the second sensor chip comprises an environment sensing element to sense an air condition from an outside environment.

13. The electronic device according to claim 12, wherein the environment sensing element senses air entering the back chamber via the front chamber.

14. The electronic device according to claim 1, wherein the package component has a separating wall and a cover, the separating wall is disposed on the substrate and separates different chambers, and the cover is disposed on the separating wall.

15. The electronic device according to claim 14, wherein the back chamber comprises a first back chamber and a second back chamber, the first back chamber is formed in the inner space of the substrate, and the second back chamber is formed in a space jointly defined by the separating wall, the cover, and the substrate.

16. The electronic device according to claim 15, wherein the first sensor chip and the second sensor chip are arranged in a horizontal direction, and the second sensor chip is located in the second back chamber.

17. The electronic device according to claim 15, wherein the substrate comprises a second through hole, and the second through hole is misaligned with the second sensor chip, so that the first back chamber and the second back chamber form an air communication.

18. The electronic device according to claim 15, wherein an orthographic projection of the first back chamber on the substrate overlaps with orthographic projections of the front chamber and the second back chamber on the substrate.

* * * * *